United States Patent
Itaya et al.

(10) Patent No.: US 11,228,064 B2
(45) Date of Patent: Jan. 18, 2022

(54) BATTERY MODULE AND BATTERY UNIT HAVING A SENSOR DEVICE MOUNTED THEREON

(71) Applicant: HONDA MOTOR CO., LTD., Tokyo (JP)

(72) Inventors: Hiroki Itaya, Saitama (JP); Kazuhisa In, Saitama (JP); Takaaki Iijima, Saitama (JP); Atsushi Nakano, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 160 days.

(21) Appl. No.: 16/697,621

(22) Filed: Nov. 27, 2019

(65) Prior Publication Data

US 2020/0185793 A1 Jun. 11, 2020

(30) Foreign Application Priority Data

Dec. 10, 2018 (JP) .............................. JP2018-230998

(51) Int. Cl.
*H01M 10/48* (2006.01)
*H01M 50/20* (2021.01)

(52) U.S. Cl.
CPC ......... *H01M 10/482* (2013.01); *H01M 50/20* (2021.01); *H01M 2220/20* (2013.01)

(58) Field of Classification Search
CPC ........................... H01M 10/482; H01M 50/20
USPC ................................................. 429/156, 159
See application file for complete search history.

(56) References Cited

U.S. PATENT DOCUMENTS

| 2014/0287286 A1* | 9/2014 | Miyawaki ........... H01M 10/482 429/90 |
| 2014/0302363 A1* | 10/2014 | Miyawaki ........... H01M 10/425 429/90 |
| 2016/0254515 A1* | 9/2016 | Shimoda ............. H01M 50/308 429/61 |

FOREIGN PATENT DOCUMENTS

| JP | 2015-050057 A | 3/2015 |
| JP | 2015-106536 A | 6/2015 |
| JP | 2016-072181 A | 5/2016 |

OTHER PUBLICATIONS

Apr. 21, 2020, Japanese Office Action issued for related JP Application 2018-230998.

* cited by examiner

*Primary Examiner* — Sean P Cullen
(74) *Attorney, Agent, or Firm* — Paratus Law Group, PLLC (57) ABSTRACT

A battery module includes: a cell laminated body; a first and a second end plates which are provided at both end portions of the cell laminated body; and a sensor device which is mounted on a mounting surface and detects the voltage of each cell in the cell laminated body. The sensor device includes: a sensor device body; and a sensor fixing portion which is fixed to the first end plate by a fastening member. In the perpendicular direction, an end surface of the fastening member is located to be lower than or equal to an end surface of the sensor device body, the mounting surface of the cell laminated body is located to be lower than a bottom surface of the sensor fixing portion, and an end surface of the first end plate is located to be lower than the mounting surface of the cell laminated body.

9 Claims, 6 Drawing Sheets

BATTERY MODULE AND BATTERY UNIT HAVING A SENSOR DEVICE MOUNTED THEREON

CROSS-REFERENCE TO RELATED APPLICATIONS

The present application claims the benefit of priority of Japanese Patent Application No. 2018-230998, filed on Dec. 10, 2018, the content of which is incorporated herein by reference.

TECHNICAL FIELD

The present invention relates to a battery module and a battery unit which are mounted on an electric vehicle or the like.

BACKGROUND ART

In recent years, battery modules are mounted on electric vehicles. For example, JP-A-2016-072181 discloses a battery module including a cell laminated body constituted by laminating a plurality of cells, and a sensor device for detecting the voltage of each cell.

In recent years, in this type of the battery module, the capacity of a battery has been increased, and thus the expansion of dimensions due to cell expansion caused by temperature changes and deterioration over time cannot be ignored. For this reason, it is difficult to firmly fix a sensor device on an upper surface of a cell laminated body at two or more points, and thus there is a concern that the sensor device may be rattled due to vibration during vehicle travel.

Therefore, it is conceivable to firmly fix the sensor device to either one of the end plates provided at both end portions of the cell laminated body in a laminating direction of a plurality of cells. However, depending on the fixing structure, the end plate and battery module may increase in dimension and weight.

SUMMARY

The invention provides a battery module and a battery unit in which a sensor device can be fixed to an end plate while avoiding an increase in dimension and weight.

According to an aspect of the invention, there is provided a battery module including: a cell laminated body including a plurality of cells; a first end plate and a second end plate which are provided at both end portions of the cell laminated body in the laminating direction of the plurality of cells; and a sensor device which is mounted on a mounting surface which faces in a perpendicular direction perpendicular to the laminating direction and detects the voltage of each cell in the cell laminated body, wherein: the sensor device includes: a sensor device body; and a sensor fixing portion which extends from the sensor device body to the first end plate and is fixed to the first end plate by a fastening member fastened along the perpendicular direction; and in the perpendicular direction, an end surface of the fastening member is located to be lower than or equal to an end surface of the sensor device body, the mounting surface of the cell laminated body is located to be lower than a bottom surface of the sensor fixing portion, and an end surface of the first end plate is located to be lower than the mounting surface of the cell laminated body.

According to another aspect of the invention, there is provided a battery unit including: a first battery module; and a second battery module arranged adjacent to the first battery module, wherein: each of the first battery module and the second battery module includes: a cell laminated body including a plurality of cells; a first end plate and a second end plate which are provided at both end portions of the cell laminated body in the laminating direction of the plurality of cells; and a voltage detection line which detects the voltage of each cell; the first battery module further includes a sensor device which is mounted on a mounting surface which faces a perpendicular direction perpendicular to the laminating direction and detects the voltage of each cell of the cell laminated body; the sensor device includes: a sensor device body; and a sensor fixing portion which extends from the sensor device body to the first end plate of the first battery module and is fixed to the first end plate of the first battery module by a fastening member fastened along the perpendicular direction; a side surface of the sensor device body is provided with a first connector to which the voltage detection line of the first battery module is connected and a second connector to which the voltage detection line of the second battery module is connected; in the perpendicular direction, an end surface of the fastening member is located to be lower than or equal to an end surface of the sensor device body, the mounting surface of the cell laminated body is located to be lower than a bottom surface of the sensor fixing portion, and an end surface of the first end plate of the first battery module is located to be lower than the mounting surface of the cell laminated body; the second battery module does not include the sensor device; and all of the first end plate and the second end plate of the first battery module and the first end plate and the second end plate of the second battery module have the same shape.

Effects

According to the invention, a sensor device can be fixed to an end plate while avoiding an increase in dimension and weight.

DESCRIPTION OF EMBODIMENTS

Hereinafter, each embodiment of a battery module of the invention will be described with reference to the accompanying drawings. The drawings are viewed in the direction of the reference numerals.

[Battery Module]

Figure 1:
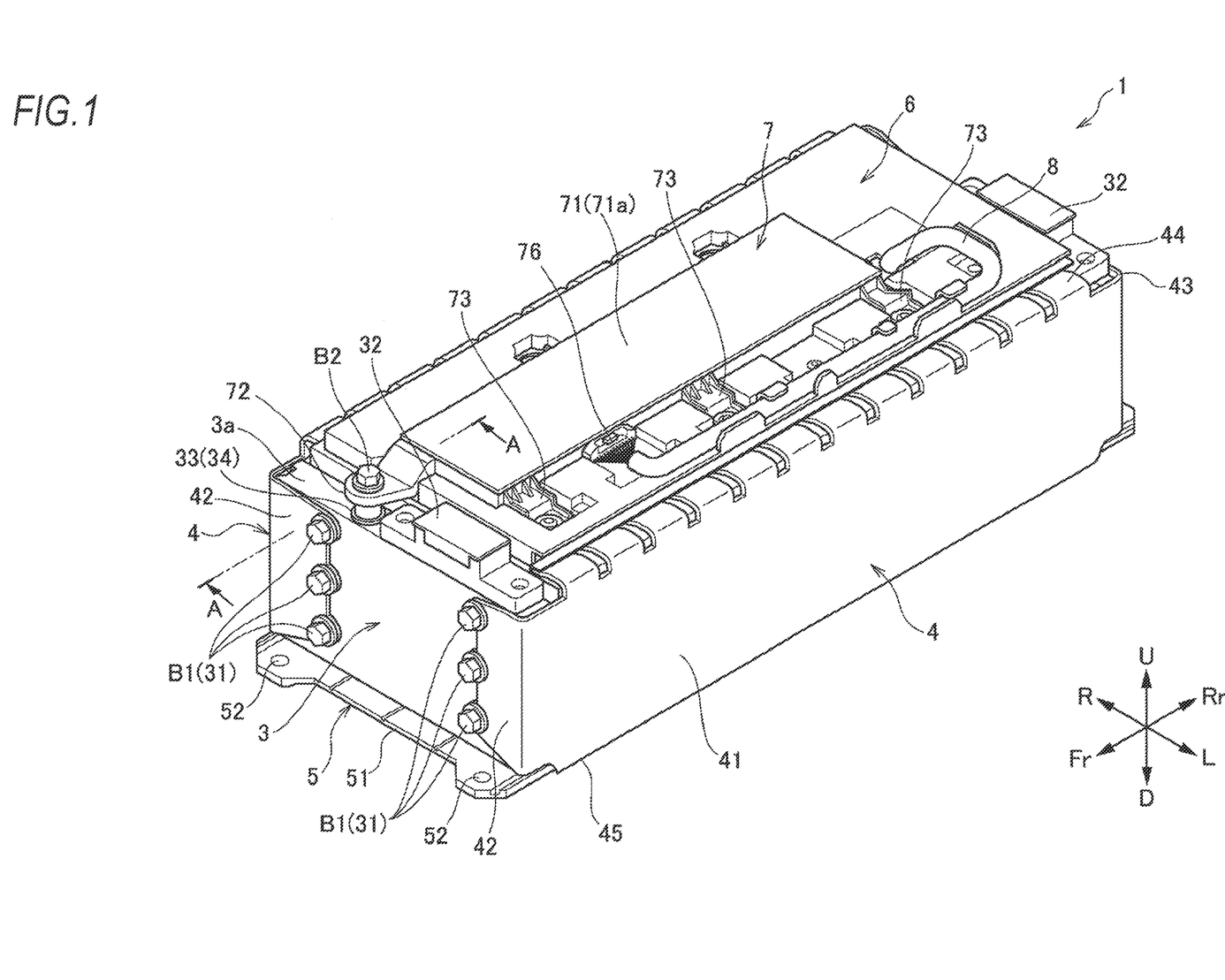
FIG. 1 is a perspective view of a battery module according to an embodiment of the invention as viewed obliquely from above.
Figure 2:
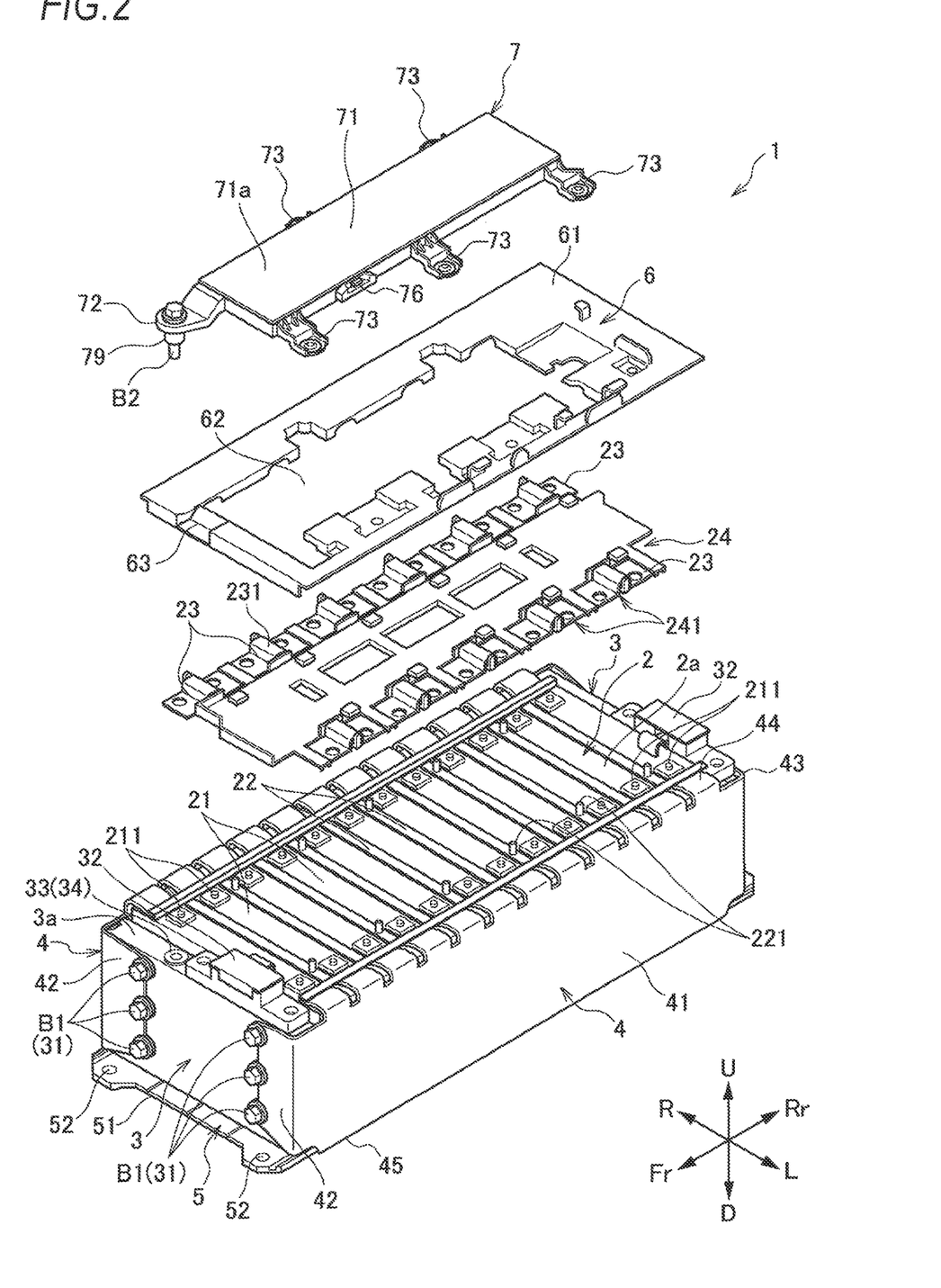
FIG. 2 is an exploded perspective view of the battery module of FIG. 1.
Figure 3:
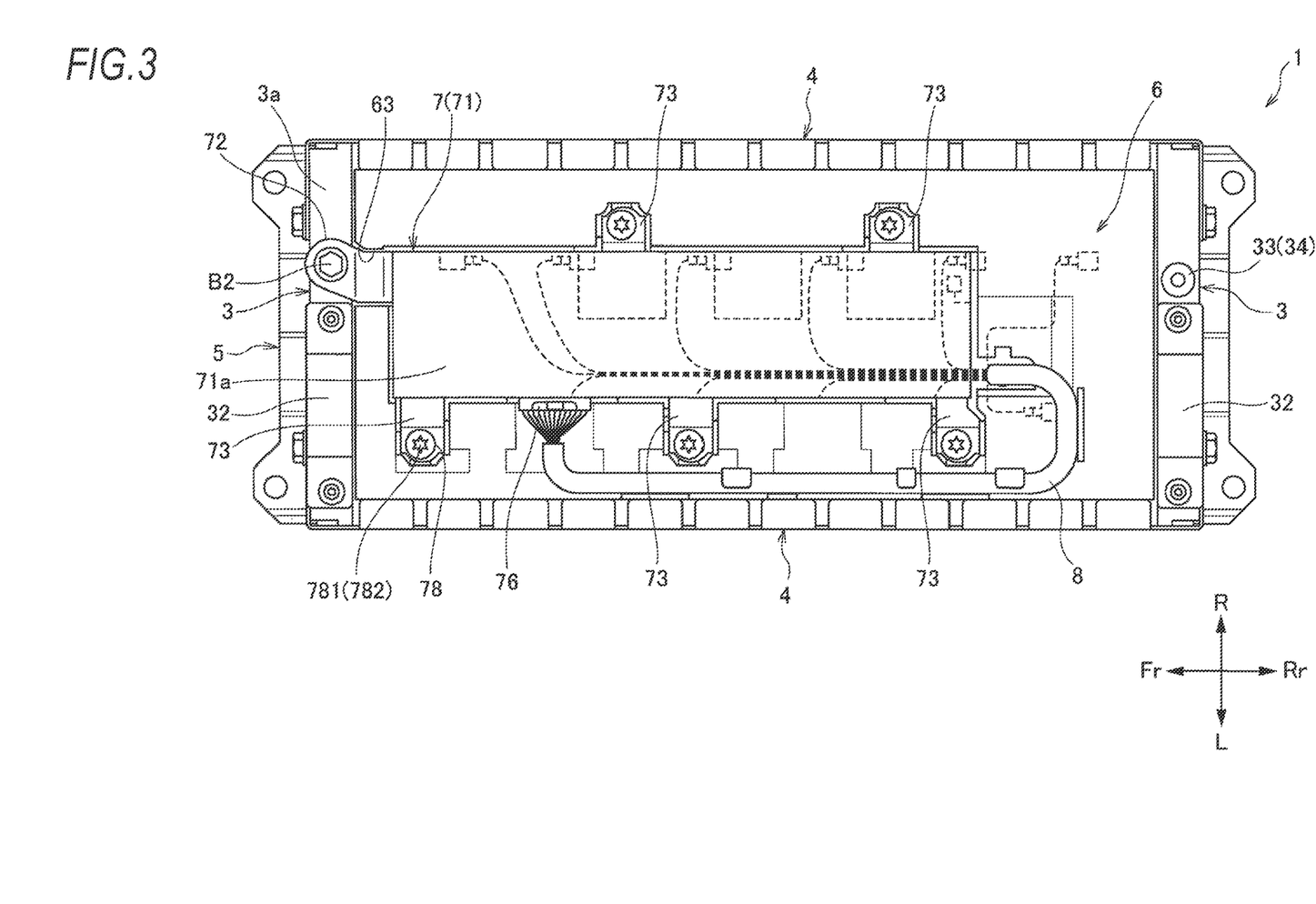
FIG. 3 is a plan view of the battery module of FIG. 1.

As illustrated in FIGS. 1 to 3, a battery module 1 according to the embodiment includes a cell laminated body 2 which is configured by laminating a plurality of cells 21 in a front-rear direction and has a front surface, a rear surface, a left surface, a right surface, an upper surface and a lower surface; a pair of end plates 3 disposed on the front and rear surfaces of the cell laminated body 2; a pair of side frames 4 arranged on the left and right surfaces of the cell laminated body 2 and connecting the pair of end plates 3; a lower plate 5 disposed on the lower surface of cell laminated body 2, a top cover 6 covering an upper surface 2a of the cell laminated body 2; and a sensor device 7 which is disposed on the upper surface 2a of the cell laminated body 2 and detects the voltage of each cell 21.

In this specification and the like, in order to simplify and clarify the description, a laminating direction of the cells 21 is defined as a front-rear direction and a direction perpendicular to the laminating direction of the cells 21 is defined as a left-right direction (width direction) and an up-down direction (height direction). Those directions are irrelevant to a front-rear direction and the like of the product on which the battery module 1 is mounted. That is, when the battery module 1 is mounted on a vehicle, the laminating direction of the cells 21 may coincide with the front-rear direction of the vehicle, may be the up-down direction or the left-right direction of the vehicle, or may be a direction inclined from those directions. In the drawings, the front of the battery module 1 is indicated as Fr, the rear as Rr, the left as L, the right as R, the upper as U, and the lower as D.

(Cell Laminated Body)

As illustrated in FIG. 2, the cell laminated body 2 is configured by alternately laminating the plurality of cells 21 and a plurality of insulating plates 22 in the front-rear direction. On the upper surface 2a of the cell laminated body 2, a plurality of bus bars 23 which are electrically connected to terminals 211 of the cells 21 are arranged. The plurality of bus bars 23 connect the terminals 211 of adjacent cells 21 so that the plurality of cells 21 are electrically connected in series. Specifically, the plurality of cells 21 are laminated so that the positive side terminal 211 and the negative side terminal 211 are sequentially reversed left and right and, by connecting the positive side (or negative side) terminal 211 of the cell 21 adjacent to the upper side in the cell laminating direction and the negative side (or positive side) terminal 211 of the cell 21 adjacent to the lower side in the cell laminating direction in sequence, the plurality of bus bars 23 electrically connect the plurality of cells 21 in series.

A bus bar plate 24 which holds the plurality of bus bars 23 is provided on the upper surface 2a of the cell laminated body 2. The bus bar plate 24 includes a plurality of bus bar holding portions 241. When the bus bar plate 24 is placed on the upper surface 2a of the cell laminated body 2, after holding the plurality of bus bars 23 in the bus bar holding portions 241, the plurality of bus bars 23 are positioned at predetermined positions capable of being connected to the corresponding terminals 211. The bus bar plate 24 is not a jig which is removed after the bus bar 23 is connected to the terminal 211, but a component of the battery module 1 which maintains the mounting state even after the bus bar 23 is connected to the terminal 211. The bus bar plate 24 is disposed between the bottom surface of the sensor device 7 and the upper surface 2a of the cell laminated body 2. As a result, the distance between the sensor device 7 and the terminal 211 of the cell 21 is shortened, and thus the electrical connection between the two becomes easy.

It is known that the cell 21 expands due to temperature changes and deterioration over time. The cell 21 has a rectangular parallelepiped shape in which the length in the up-down direction is longer than the length in the front-rear direction and the length in the left-right direction is longer than the length in the up-down direction. Therefore, the area of the front surface and the rear surface of the cell 21 is much larger than the areas of the left surface, the right surface, the upper surface and the lower surface, and the central portion in the left-right direction and the central portion in the up-down direction easily expand on the front and rear surfaces of the cell 21. When the cell 21 expands in the front-rear direction, stress acts on the bus bar 23 which connects the terminals 211 of the cell 21 together. The bus bar 23 of the embodiment has a bent portion 231 which protrudes upward at an intermediate portion in the front-rear direction in order to relieve the stress acting as the cell 21 expands.

(End Plate)

As illustrated in FIGS. 1 to 3, the pair of end plates 3 are disposed on the front and rear surfaces of the cell laminated body 2 and receive the load in the cell laminating direction of the cell laminated body 2 caused by the expansion of the cell 21. The end plate 3 of the embodiment is a metal member formed by a die casting method and a plurality of fastening portions 31 which are fastened to the side frames 4 with bolts B1 are provided at the left and right end portions of the outer surfaces which do not face the cell laminated body 2. Further, on an upper surface 3a of the pair of end plates 3, an external connection terminal block 32 for transferring power between the battery module 1 and another battery module or an external electric device is provided. A fixing portion 33 to which the sensor device 7 is fixed via a bolt B2 is formed on the upper surface 3a of at least one of the end plates 3. That is, the sensor device 7 is fixed to either one of the end plates 3, but the pair of end plates 3 of the embodiment has the same shape having the fixing portion 33. Accordingly, it is unnecessary to make the end plate 3 with or without the fixing portion 33 and the manufacturing process can be simplified by sharing parts.

Figure 5:
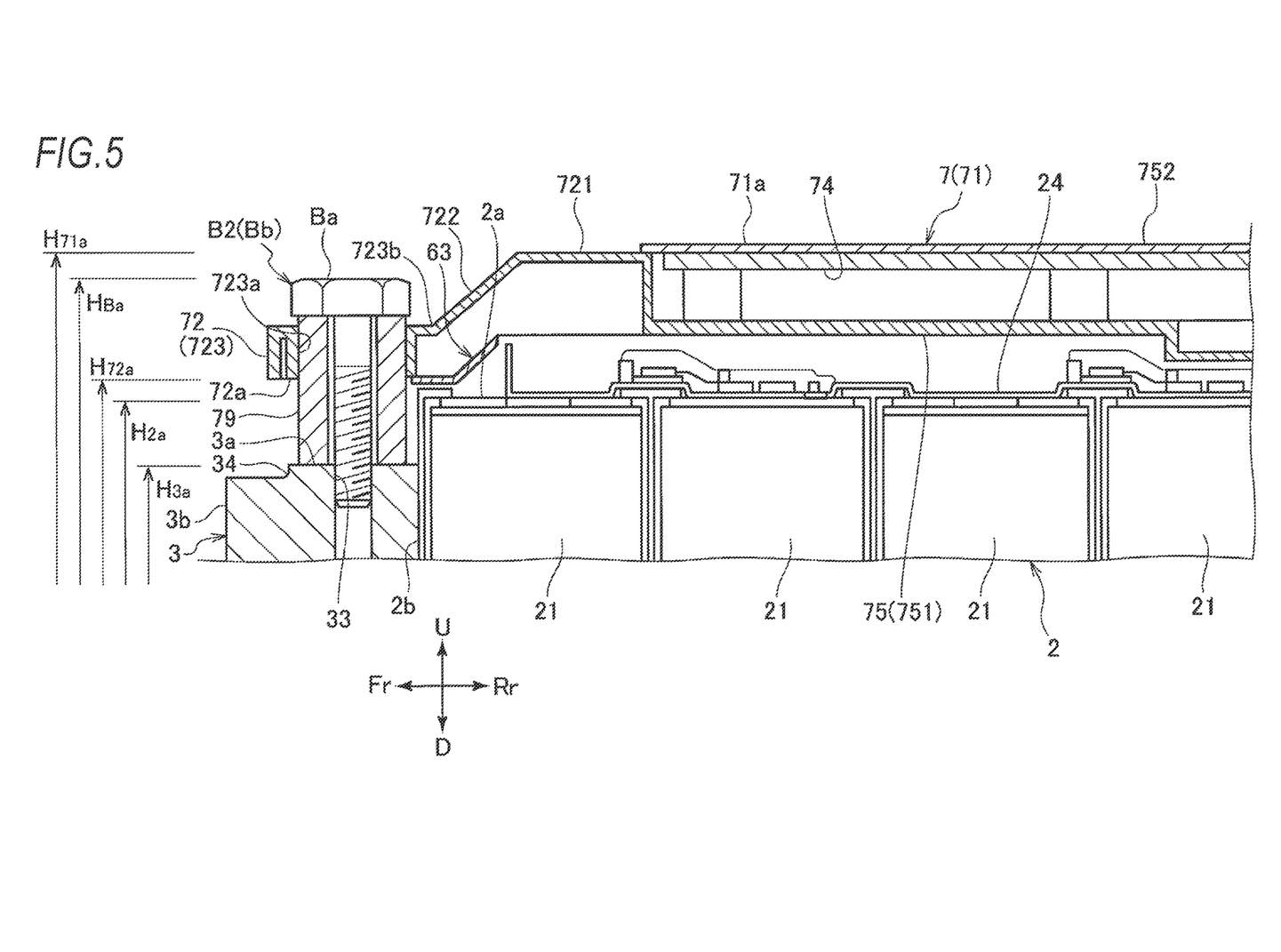
FIG. 5 is a cross-sectional view taken along the line A-A in FIG. 1.

As illustrated in FIGS. 1, 2, and 5, the upper surface 3a of the end plate 3 is lower than the upper surface 2a of the cell laminated body 2. According to such an end plate 3, the height dimension can be suppressed to reduce the weight. Further, the fixing portion 33 provided on the upper surface 3a of the end plate 3 is provided on a protruding portion 34 which protrudes further upward than other portions of the upper surface 3a in the height direction. That is, it is possible to further reduce the weight of the end plate 3 by increasing the thickness of only a portion where the height is required in the upper surface 3a of the end plate 3. Moreover, since the protruding portion 34 can be integrally formed in the end plate 3 by the die-cast manufacturing method, the manufacturing cost can be reduced.

(Side Frame)

As illustrated in FIGS. 1 to 3, the side frames 4 are formed by pressing a metal plate material and include side frame bodies 41 extending along the left and right surfaces of the cell laminated body 2; front flange portions 42 extending from the front ends of the side frame bodies 41 along the front surface of the front end plate 3 toward each other; rear flange portions 43 extending from the rear ends of the side frame main bodies 41 along the rear surface of the rear end plate 3 toward each other; upper flange portions 44 extending from the upper ends of the side frame bodies 41 along the upper surface of the cell laminated body 2 toward each other; and a lower flange portions 45 extending from the lower ends of the side frame bodies 41 along the lower surface of the cell laminated body 2 (lower plate 5) toward each other.

The front flange portion 42 and the rear flange portion 43 are fastened to the front end plate 3 or the rear end plate 3 via the bolts B1. Accordingly, the pair of end plate 3 is connected via the pair of side frame 4. The pair of side frames 4 allows relative displacement in the front-rear direction between the end plates 3 when the load in the cell laminating direction of the cell laminated body 2 increases. For example, the relative displacement in the front-rear direction between the end plates 3 is allowed by deformation in the front-rear direction of the side frame main bodies 41, change in angle between the side frame main bodies 41 and the front flange portion 42 or the rear flange portion 43, and the like.

(Lower Plate)

As illustrated in FIGS. 1 and 2, the lower plate 5 is formed using an aluminum extruded material and includes a lower plate body 51 extending along the lower surfaces of the cell laminated body 2 and the end plates 3, a plurality of fixing portions 52 fixed to a module support structure (not illustrated) which supports the battery module 1, and a retaining portion (not illustrated) to which the lower flange portion 45 of the side frame 4 is retained.

(Top Cover)

As illustrated in FIGS. 1 to 3, the top cover 6 is made of resins and includes a top cover body 61 covering the upper side of the bus bar plate 24, an opening portion 62 for accommodating the sensor device body 71 of the sensor device 7, and a recess portion 63 for accommodating at least a part of a first sensor fixing portion 72 of the sensor device 7 fixed to the fixing portion 33 of the end plate 3. According to such a top cover 6, the protrusion of the sensor device body 71 and the first sensor fixing portion 72 in the height direction can be reduced while protecting the bus bar plate 24.

(Sensor Device)

As illustrated in FIGS. 1 to 5, the sensor device 7 includes the sensor device body 71, the first sensor fixing portion 72 which extends from the sensor device body 71 to the end plate 3 on the front side and is fixed to the fixing portion 33 of the end plate 3 by a bolt B2 which is fastened along the height direction, and a plurality of second sensor fixing portions 73 which extend in the left-right direction from the sensor device body 71 and are fixed to the upper surface 2a of the cell laminated body 2.

Figure 4:
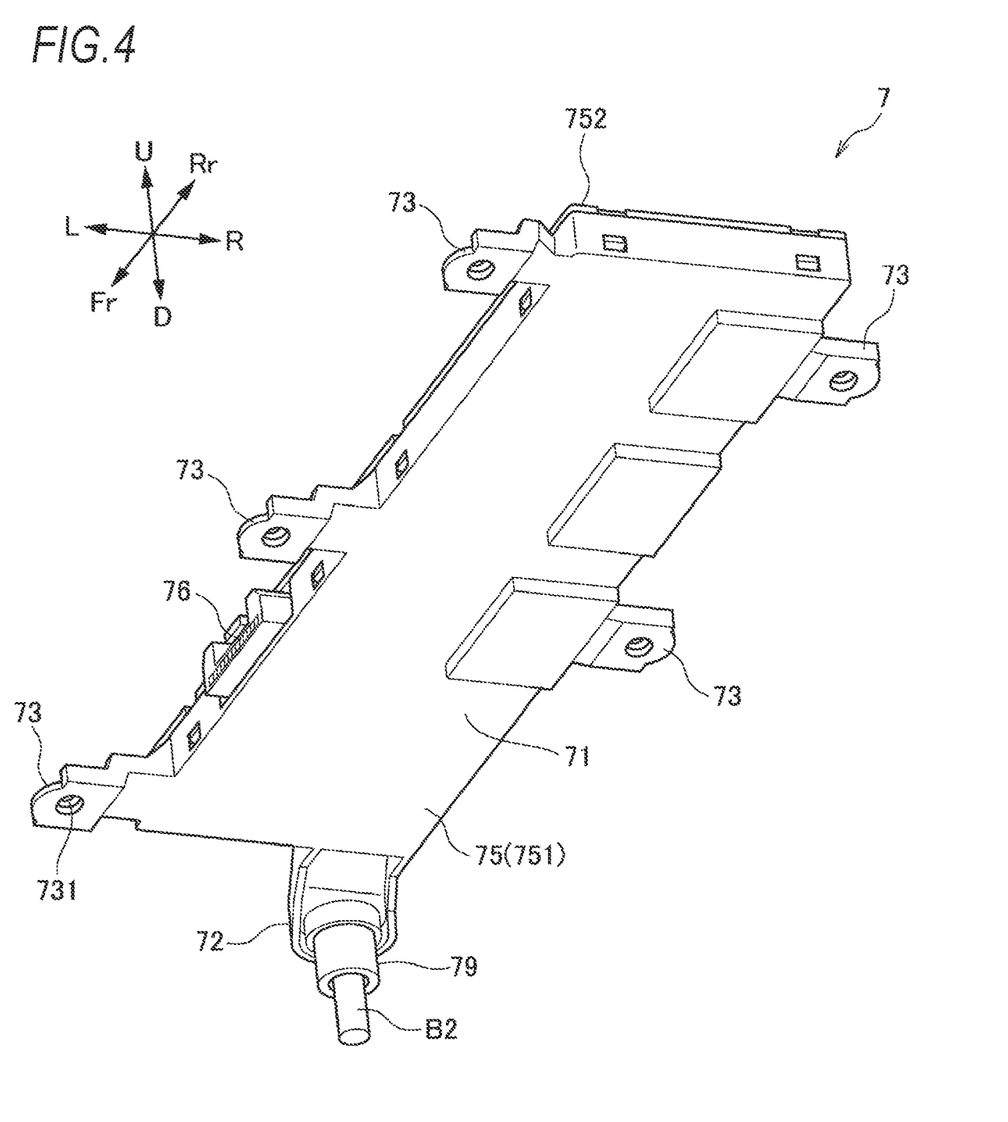
FIG. 4 is a perspective view of a sensor device of the battery module of FIG. 1 as viewed obliquely from below.

The sensor device body 71 includes a substrate 74 on which electronic components are mounted, a case 75 which accommodates the substrate 74, and a voltage detection connector 76 which is disposed on a side surface of the case 75.

The case 75 includes a case body 751 which covers the lower surface side of the substrate 74 and a case cover 752 which covers the upper surface side of the substrate 74. Respective bus bars 23 are connected to the voltage detection connector 76 via a plurality of voltage detection lines 8.

The first sensor fixing portion 72 and a plurality of second sensor fixing portions 73 are integrally formed with the case 75. The plurality of second sensor fixing portions 73 are fixed to the plurality of insulating plates 22 spaced in the front-rear direction so as to be immovable in the up-down direction and to be movable in the front-rear direction. Specifically, as illustrated in FIG. 2, the insulating plate 22 has a cylindrical or columnar protrusion portion 221 protruding upward and the second sensor fixing portion 73 has a hole 731 which accommodates the protrusion portion 221 in a state where the protrusion portion 221 is inserted from below. The hole 731 is a long hole which is long in the front-rear direction and can allow relative movement in the front-rear direction between the insulating plate 22 and the sensor device 7 as the cell 21 expands.

The second sensor fixing portion 73 is inserted in the protrusion portion 221 of the insulating plate 22 from above and then fixed in the up-down direction by a push nut 78 which is mounted by press-fitting into the protrusion portion 221 from above. The push nut 78 has a plurality of claw portions 782 inclined upward at the peripheral edge portion of a hole 781 formed in the center portion. When the push nut 78 is press-fit into the protrusion portion 221 from above, the plurality of claw portions 782 bite into the outer peripheral portion of the protrusion portion 221 so that upward pulling is restricted. As a result, the second sensor fixing portion 73 is fixed to the protrusion portion 221 of the insulating plate 22 via the push nut 78 in the up-down direction and the movement in the front-rear direction with respect to the protrusion portion 221 of the insulating plate 22 is allowed by the hole 731 formed of a long hole.

The first sensor fixing portion 72 is fixed to the fixing portion 33 provided on one end plate 3 so as to be immovable at least in the front-rear direction and the left-right direction via the bolt B2. Accordingly, the sensor device 7 is fixed in the front-rear direction and the left-right direction by the first sensor fixing portion 72 and is fixed in the up-down direction by the second sensor fixing portion 73. Therefore, while allowing the relative movement of the insulating plate 22 and the sensor device 7 in the front-rear direction along with the expansion of the cell 21, it is possible to suppress the sensor device 7 from rattling in the front-rear direction, the left-right direction, and the up-down direction due to the vibration during vehicle travel.

As illustrated in FIG. 5, in the up-down direction, an upper surface Ba of the bolt B2 is located to be lower than or equal to an upper surface 71a of the sensor device body 71 and the upper surface 2a of the cell laminated body 2 is located to be lower than a bottom surface 72a of the first sensor fixing portion 72. In this way, the protrusion of the bolt B2 in the height direction can be prevented, and thus the size of the battery module 1 can be reduced. Further, since the upper surface 2a of the cell laminated body 2 is located to be lower than the bottom surface 72a of the first sensor fixing portion 72, interference between the first sensor fixing portion 72 and the cell laminated body 2 is prevented.

As described above, since the upper surface 3a of the end plate 3 to which the first sensor fixing portion 72 is fixed is located to be lower than the upper surface 2a of the cell laminated body 2, a gap is formed between the bottom surface 72a of the first sensor fixing portion 72, which is located to be higher than the upper surface 2a of the cell laminated body 2, and the upper surface 3a of the end plate 3. In the embodiment, a collar 79 is used to fill this gap. Specifically, the first sensor fixing portion 72 includes a connection portion 721 which is connected to the sensor device body 71 and has substantially the same vertical height as the sensor device body 71, an inclined portion 722 which inclines so that the height in the up-down direction becomes lower as the inclined portion 722 extends from the connection portion 721 toward the end plate 3, and a seat portion 723 which is connected to the end portion of the inclined portion 722 and is seated with the bolt B2 thereon. The seat portion 723 is provided with a collar through-hole 723a through which the collar 79 passes in the up-down direction and the bolt B2 is fastened to the fixing portion 33 of the end plate 3 through the collar 79.

According to such a first sensor fixing portion 72, the upper surface Ba of the bolt B2 can be set below the upper surface 71a of the sensor device body 71 by the inclined portion 722. Also, the bolt B2 and the end plate 3 can be stably fixed by interposing the collar 79 penetrating the first sensor fixing portion 72 between the head portion Bb of the bolt B2 and the upper surface 3a of the end plate 3.

In FIG. 5, reference sign $H_{3a}$ is the height of the upper surface 3a of the end plate 3, reference sign $H_{2a}$ is the height of the upper surface 2a of the cell laminated body 2, reference sign $H_{72a}$ is the height of the bottom surface 72a of the first sensor fixing portion 72, reference sign $H_{Ba}$ is the height of the upper surface Ba of the bolt B2, and reference sign $H_{71a}$ is the height of the upper surface 71a of the sensor device body 71, where the relationship of $H_{3a} < H_{2a} < H_{72a} < H_{Ba} H_{71a}$ is satisfied.

In the embodiment, the seat portion 723 of the first sensor fixing portion 72 is overlapped with the cell laminated body 2 in the front-rear direction. That is, a rear end portion 723b of the seat portion 723 and a front end portion 2b of the cell laminated body 2 overlap in the front-rear direction. In this way, it is possible to suppress the first sensor fixing portion 72 from protruding outward in the front-rear direction.

Furthermore, in the embodiment, the first sensor fixing portion 72 and the bolt B2 are arranged further on the inner side (cell 21 side) than an outer edge portion 3b of the end plate 3 in the front-rear direction. In this way, the first sensor fixing portion 72 and the bolt B2 can be prevented from protruding outward in the front-rear direction, and thus the size of the battery module 1 can be reduced.

[Battery Module]

Next, a battery unit 100 including a first battery module 1A and a second battery module 1B arranged adjacent to each other will be described with reference to FIG. 6. In addition, regarding the configuration common to that of the battery module 1 described above, the description of the battery module 1 described above is cited by using the same reference signs as those of the battery module 1 described above.

Figure 6:
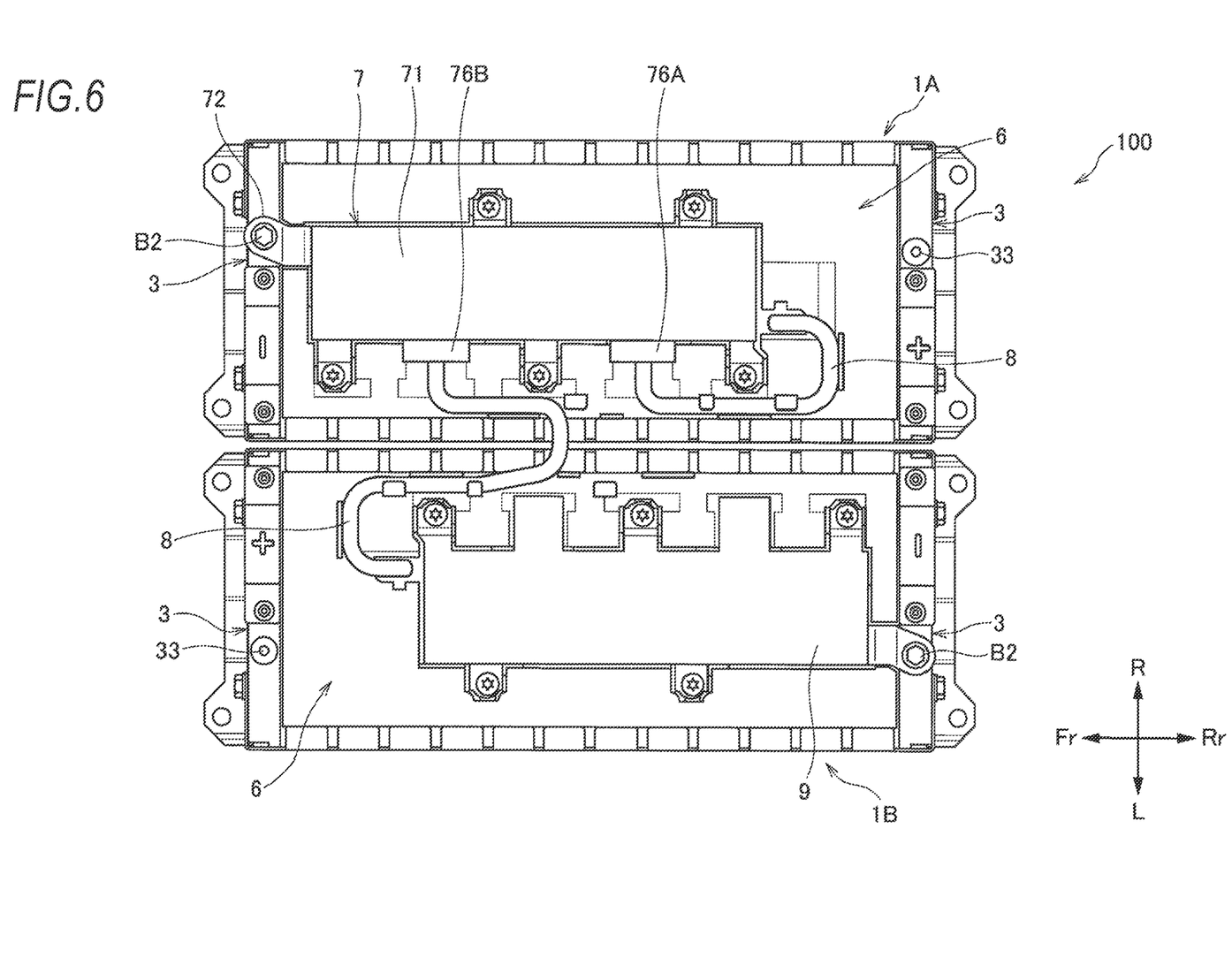
FIG. 6 is a plan view of a battery unit according to the embodiment of the invention.

As illustrated in FIG. 6, the two battery modules 1A and 1B constituting the battery unit 100 respectively include the cell laminated body 2 configured by laminating the plurality of cells 21, the pair of end plates 3 provided at both end portions of the cell laminated body 2 in the front-rear direction, and voltage detection lines 8 for detecting the voltage of each cell 21. One first battery module 1A further includes the sensor device 7 which is disposed on the upper surface 2a of the cell laminated body 2 and detects the voltage of each cell 21.

The sensor device 7 includes the sensor device body 71 and the first sensor fixing portion 72 extending from the sensor device body 71 to one end plate 3 of the first battery module 1A and fixed to one end plate 3 by the bolt B2 fastened along the up-down direction. On the side surface of the sensor device body 71, a first voltage detection connector 76A to which the voltage detection lines 8 of the first battery module 1A are connected and a second voltage detection connector 76B to which the voltage detection lines 8 of the second battery module 18 are connected. That is, the second battery module 1B does not include the sensor device 7 and the cell voltage of the second battery module 1B is also detected by the sensor device 7 mounted on the first battery module 1A. In FIG. 6, the reference sign 9 denotes a dummy cover.

According to such a battery unit 100, since the sensor device 7 is not required for the second battery module 18, the manufacturing cost of the battery unit 100 can be reduced. Further, when the pair of end plates 3 of the first battery module 1A and the pair of end plates 3 of the second battery module 1B have the same shape, the manufacturing cost of the battery unit 100 can be further reduced.

The embodiments described above can be modified, improved, or the like as appropriate. For example, in the sensor device 7 of the embodiment described above, the first sensor fixing portion 72 is provided in the case 75 which accommodates the substrate 74 and the first sensor fixing portion 72 is fixed to the end plate 3. However, in a battery module which does not include a case and is fixed to the end plate 3 in a state where the substrate is exposed, the substrate is provided with portions corresponding to the first sensor fixing portion 72 of the embodiment described above and those portions may be fixed to the end plate 3 with the same fixing structures as those of the first sensor fixing portion 72.

This specification describes at least the following matters. In addition, although the components or the likes which correspond to those in the embodiment described above are described in parenthesis, the invention is not limited thereto.

(1) A battery module (battery module 1) comprising a cell laminated body (cell laminated body 2) constituted by laminating a plurality of cells (cells 21), a first end plate (end plate 3) and a second end plate (end plate 3) which are provided at both end portions of the cell laminated body in the laminating direction (front-rear direction) of the plurality of cells, and a sensor device (sensor device 7) which is mounted on a mounting surface (upper surface 2a) which faces in a perpendicular direction (up-down direction) perpendicular to the laminating direction and detects the voltage of each cell in the cell laminated body, where the sensor device includes a sensor device body (sensor device body 71), and a sensor fixing portion (first sensor fixing portion 72) which extends from the sensor device body to the first end plate and is fixed to the first end plate by a fastening member (bolt B2) fastened along the perpendicular direction, and in the perpendicular direction, an end surface (upper surface 8a) of the fastening member is located to be lower than or equal to an end surface (upper surface 71a) of the sensor device body, the mounting surface of the cell laminated body is located to be lower than a bottom surface (bottom surface 72a) of the sensor fixing portion, and an end surface (upper surface 3a) of the first end plate is located to be lower than the mounting surface of the cell laminated body.

According to (1), since the end surface of the fastening member is located to be lower than or equal to the end surface of the sensor device body, the protrusion of the fastening member can be prevented, and thus the size of the battery module can be reduced. Moreover, since the mounting surface of the cell laminated body is located to be lower than the bottom surface of the sensor fixing portion, the interference between the sensor fixing portion and the cell laminated body is prevented. In addition, since the end surface of the first end plate to which the sensor fixing portion is fixed is located to be lower than the mounting surface of the cell laminated body, the height of the first end plate can be suppressed, and thus the weight of the first end plate can be reduced.

(2) The battery module according to (1), where a plurality of bus bars (bus bars 23) each of which connects terminals (terminals 211) of adjacent cells are held on a bus bar plate (bus bar plate 24), and the bus bar plate is provided between the sensor device and the cell laminated body.

According to (2), the distance between the sensor device and the terminal of the cell can be shortened by arranging the bus bar plate between the sensor device and the cell laminated body.

(3) The battery module according to (2), where the bus bar plate is covered with a top cover (top cover 6), and the top cover is provided with a recess portion (recess portion 63) which accommodates at least a part of the sensor fixing portion.

According to (3), since the top cover is provided with the recess portion which accommodates at least a part of the sensor fixing portion, the protrusion of the sensor fixing portion can be reduced while protecting the bus bar plate.

(4) The battery module according to any one of (1) to (3), where the fastening member is a bolt (bolt B2), the sensor fixing portion includes a hole (collar through-hole 723a) through which the bolt passes and a seat portion (seat portion 723) on which a bolt head (head portion Bb) is seated, and the seat portion overlaps the cell laminated body in the laminating direction.

According to (4), since the seat portion of the sensor fixing portion overlaps the cell laminated body in the laminating direction, it is possible to suppress the sensor fixing portion from protruding outward in the laminating direction.

(5) The battery module according to any one of (1) to (4), where the sensor fixing portion and the fastening member are arranged inside an outer edge portion (outer edge portion 3b) of the first end plate in the laminating direction.

According to (5), since the sensor fixing portion and the fastening member are disposed inside the outer edge portion of the first end plate in the laminating direction, the sensor fixing portion and the fastening member can be prevented from protruding outward in the laminating direction.

(6) The battery module according to (5), where a fixing portion (fixing portion 33) of the first end plate to which the fastening member is fastened is provided in a protruding portion (protruding portion 34) which further protrudes than the other portion in the perpendicular direction, and the protruding portion is integrally formed by a die-casting method.

According to (6), the weight of the first end plate can be reduced by increasing the thickness of the necessary part. Further, the manufacturing cost can be reduced by integrally forming the protruding portion by a die-casting method.

(7) The battery module according to any one of (1) to (6), where the sensor fixing portion includes a connection portion (connection portion 721) which is connected to the sensor device body and has substantially the same height in the perpendicular direction as that of the sensor device body, an inclined portion (inclined portion 722) which is inclined so that the height in the perpendicular direction becomes lower as the inclined portion extends from the connection portion toward the first end plate, and a seat portion (seat portion 723) which is connected to an end portion of the inclined portion and is seated with the fastening member thereon, the seat portion is provided with a collar through-hole (collar through-hole 723a) through which a collar (collar 79) passes, and the fastening member is fastened to the first end plate via the collar.

According to (7), the end surface of the fastening member can be set below the end surface of the sensor device body by the inclined portion of the sensor fixing portion. Further, by interposing the collar penetrating the sensor fixing portion between the head portion of the fastening member and the end surface of the first end plate, the fastening member and the first end plate can be stably fixed.

(8) The battery module according to any one of (1) to (7), where the first end plate and the second end plate have the same shape.

According to (8), by making the first end plate and the second end plate the same shape, a common end plate can be used, and thus the size of the battery module can be reduced.

(9) A battery unit (battery unit 100) which includes a first battery module (first battery module 1A) and a second battery module (second battery module 1B) arranged adjacent to each other, where each of the first battery module and the second battery module includes a cell laminated body (cell laminated body 2) constituted by laminating a plurality of cells (cells 21), a first end plate (end plate 3) and a second end plate (end plate 3) which are provided at both end portions of the cell laminated body in the laminating direction of the plurality of cells, and a voltage detection line (voltage detection line 8) which detects the voltage of each cell, the first battery module further includes a sensor device (sensor device 7) which is mounted on a mounting surface (upper surface 2a) which faces a perpendicular direction perpendicular to the laminating direction and detects the voltage of each cell of the cell laminated body, the sensor device includes a sensor device body (sensor device body 71), and a sensor fixing portion (first sensor fixing portion 72) which extends from the sensor device body to the first end plate of the first battery module and is fixed to the first end plate of the first battery module by a fastening member (bolt B2) fastened along the perpendicular direction, a side surface of the sensor device body is provided with a first connector (first voltage detection connector 76A) to which the voltage detection lines of the first battery module is connected and a second connector (second voltage detection connector 76B) to which the voltage detection lines of the second battery module is connected, in the perpendicular direction, an end surface (upper surface Ba) of the fastening member is located to be lower than or equal to an end surface (upper surface 71a) of the sensor device body, the mounting surface of the cell laminated body is located to be lower than a bottom surface (bottom surface 72a) of the sensor fixing portion, and an end surface (upper surface 3a) of the first end plate of the first battery module is located to be lower than the mounting surface of the cell laminated body, the second battery module does not include the sensor device, and all of the first end plate and the second end plate of the first battery module and the first end plate and the second end plate of the second battery module have the same shape.

According to (9), in the first battery module, since the end surface of the fastening member is located to be lower than or equal to the end surface of the sensor device body, it is possible to prevent the fastening member from protruding, and thus the size of the battery module can be reduced. Further, since the mounting surface of the cell laminated body is located to be lower than the bottom surface of the sensor fixing portion, the interference between the sensor fixing portion and the cell laminated body is prevented. In addition, since the end surface of the first end plate to which the sensor fixing portion is fixed is located to be lower than the mounting surface of the cell laminated body, the height of the first end plate can be suppressed, and thus the weight of the first end plate can be reduced.

Furthermore, since the voltage detection lines of the second battery module are connected to the sensor device arranged in the first battery module, the sensor device is not required in the second battery module. By making all the end plates common to the first battery module and the second battery module, the manufacturing cost of the battery unit can be reduced.

The invention claimed is:

1. A battery module comprising:
a cell laminated body including a plurality of cells;
a first end plate provided at one end portion of the cell laminated body in a laminating direction of the plurality of cells and a second end plate provided at another end portion of the cell laminated body in the laminating direction of the plurality of cells; and
a sensor device which is mounted on an upper surface of the cell laminated body which faces in an up-down direction perpendicular to the laminating direction and detects a voltage of each cell in the cell laminated body, wherein:
the sensor device includes:
a sensor device body; and
a sensor fixing portion which extends from the sensor device body to the first end plate and is fixed to the first end plate by a fastening member fastened along the up-down direction; and
in the up-down direction, an upper surface of the fastening member is located to be lower than or equal to an upper surface of the sensor device body, the upper surface of the cell laminated body is located to be lower than a bottom surface of the sensor fixing portion, and an upper surface of the first end plate is located to be lower than the upper surface of the cell laminated body.

2. The battery module according to claim 1, wherein the first end plate and the second end plate have the same shape.

3. The battery module according to claim 1, wherein:
the fastening member is a bolt;
the sensor fixing portion includes a hole through which the bolt passes and a seat portion on which a bolt head is seated; and
the seat portion overlaps the cell laminated body in the laminating direction.

4. The battery module according to claim 1, wherein:
the sensor fixing portion includes:
a connection portion which is connected to the sensor device body and has substantially the same height in the up-down direction as that of the sensor device body;
an inclined portion which is inclined so that the height in the up-down direction becomes lower as the inclined portion extends from the connection portion toward the first end plate; and
a seat portion which is connected to an end portion of the inclined portion and is seated with the fastening member thereon;
the seat portion is provided with a collar through-hole through which a collar passes; and
the fastening member is fastened to the first end plate via the collar.

5. The battery module according to claim 1, wherein the sensor fixing portion and the fastening member are arranged inside an outer edge portion of the first end plate in the laminating direction.

6. The battery module according to claim 5, wherein:
a fixing portion of the first end plate to which the fastening member is fastened is provided at a protruding portion which protrudes further than other portions of the first end plate in the up-down direction; and
the protruding portion is integrally formed by a die-casting method.

7. The battery module according to claim 1, wherein:
a plurality of bus bars each of which connects terminals of adjacent cells are held on a bus bar plate; and
the bus bar plate is provided between the sensor device and the cell laminated body.

8. The battery module according to claim 7, wherein:
the bus bar plate is covered with a top cover; and
the top cover is provided with a recess portion which accommodates at least a part of the sensor fixing portion.

9. A battery unit comprising:
a first battery module; and
a second battery module arranged adjacent to the first battery module, wherein:
each of the first battery module and the second battery module includes:
a cell laminated body including a plurality of cells;
a first end plate provided at one end portion of the cell laminated body in a laminating direction of the plurality of cells and a second end plate provided at another end portion of the cell laminated body in the laminating direction of the plurality of cells; and
a voltage detection line which detects a voltage of each cell;
the first battery module further includes a sensor device which is mounted on an upper surface which faces an up-down direction perpendicular to the laminating direction and detects the voltage of each cell of the cell laminated body;
the sensor device includes:
a sensor device body; and
a sensor fixing portion which extends from the sensor device body to the first end plate of the first battery module and is fixed to the first end plate of the first battery module by a fastening member fastened along the up-down direction;
a side surface of the sensor device body is provided with a first connector to which the voltage detection line of the first battery module is connected and a second connector to which the voltage detection line of the second battery module is connected;
in the up-down direction, an upper surface of the fastening member is located to be lower than or equal to an upper surface of the sensor device body, the mounting surface of the cell laminated body is located to be lower than a bottom surface of the sensor fixing portion, and an upper surface of the first end plate of the first battery module is located to be lower than the upper surface of the cell laminated body;
the second battery module does not include the sensor device; and
all of the first end plate and the second end plate of the first battery module and the first end plate and the second end plate of the second battery module have the same shape.

* * * * *